(12) United States Patent
Nikonov et al.

(10) Patent No.: US 9,847,475 B2
(45) Date of Patent: Dec. 19, 2017

(54) MAGNETIC DOMAIN WALL LOGIC DEVICES AND INTERCONNECT

(71) Applicant: Intel Corporation, Santa Clara, CA (US)

(72) Inventors: Dmitri E. Nikonov, Beaverton, OR (US); Sasikanth Manipatruni, II, Hillsboro, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/119,380

(22) PCT Filed: Mar. 25, 2014

(86) PCT No.: PCT/US2014/031781
§ 371 (c)(1),
(2) Date: Aug. 16, 2016

(87) PCT Pub. No.: WO2015/147807
PCT Pub. Date: Oct. 1, 2015

(65) Prior Publication Data
US 2017/0069831 A1   Mar. 9, 2017

(51) Int. Cl.
*H01L 43/08* (2006.01)
*H01L 43/10* (2006.01)

(52) U.S. Cl.
CPC .............. *H01L 43/08* (2013.01); *H01L 43/10* (2013.01)

(58) Field of Classification Search
CPC ................................. H01L 43/08; H01L 43/10
See application file for complete search history.

(56) References Cited

U.S. PATENT DOCUMENTS

| | | | |
|---|---|---|---|
| 6,977,181 B1* | 12/2005 | Raberg | B82Y 10/00 257/E21.665 |
| 7,312,960 B2* | 12/2007 | Matsuzaka | B82Y 10/00 360/324.11 |
| 8,085,581 B2 | 12/2011 | Xia | |

(Continued)

FOREIGN PATENT DOCUMENTS

| JP | 2013-232497 A | 11/2013 |
|---|---|---|
| TW | 2010-27742 A | 7/2010 |
| WO | WO 2011/115794 | 9/2011 |

OTHER PUBLICATIONS

Notification dated Nov. 2, 2016 from the European Patent Office for European Patent Application No. 14887532.-1556, PCT/US2014/031781 (2 pages).

(Continued)

*Primary Examiner* — Sophia Nguyen
(74) *Attorney, Agent, or Firm* — Schwabe, Williamson & Wyatt P.C.

(57) ABSTRACT

Described is an apparatus which comprises: first, second, and third free magnetic layers; a first metal layer of first material coupled to the first and third free magnetic layers; and a second metal layer of second material different from the first material, the second metal layer coupled to the second and third free magnetic layers. Described is an STT majority gate device which comprises: a free magnetic layer in a ring; and first, second, third, and fourth free magnetic layers coupled to the free magnetic layer.

17 Claims, 13 Drawing Sheets

(56) References Cited

U.S. PATENT DOCUMENTS

| | | | | |
|---|---|---|---|---|
| 2006/0034117 A1* | 2/2006 | Jeong | G11C 11/16 | 365/158 |
| 2006/0038213 A1* | 2/2006 | Mori | B82Y 25/00 | 257/295 |
| 2006/0072250 A1* | 4/2006 | Aono | B82Y 10/00 | 360/324.11 |
| 2006/0110625 A1* | 5/2006 | Nakabayashi | B82Y 25/00 | 428/816 |
| 2007/0206405 A1* | 9/2007 | Lim | B82Y 10/00 | 365/158 |
| 2007/0297222 A1* | 12/2007 | Leuschner | G11C 11/15 | 365/171 |
| 2008/0186638 A1* | 8/2008 | Nishimura | B82Y 10/00 | 360/324.2 |
| 2009/0147562 A1* | 6/2009 | Clinton | G11C 11/16 | 365/158 |
| 2009/0161267 A1* | 6/2009 | Kawai | B82Y 10/00 | 360/324.2 |
| 2010/0013035 A1 | 1/2010 | Ruehrig et al. | | |
| 2010/0104275 A1* | 4/2010 | Takeya | G02B 7/102 | 396/543 |
| 2010/0134923 A1* | 6/2010 | Clinton | G11C 11/16 | 360/131 |
| 2010/0290281 A1 | 11/2010 | Kim et al. | | |
| 2011/0089509 A1 | 4/2011 | Lu et al. | | |
| 2011/0147816 A1* | 6/2011 | Nikonov | B82Y 25/00 | 257/295 |
| 2011/0303995 A1* | 12/2011 | Worledge | B82Y 25/00 | 257/421 |
| 2012/0154063 A1 | 6/2012 | Nikonov et al. | | |
| 2012/0175717 A1* | 7/2012 | Bessho | G11C 11/16 | 257/421 |
| 2012/0248556 A1 | 10/2012 | Nikonov et al. | | |
| 2012/0300541 A1* | 11/2012 | Higo | G11C 11/16 | 365/171 |
| 2013/0009260 A1* | 1/2013 | Apalkov | H01L 43/08 | 257/421 |
| 2013/0140658 A1* | 6/2013 | Yamane | H01L 29/82 | 257/421 |
| 2013/0163317 A1* | 6/2013 | Yamane | G11C 11/161 | 365/158 |
| 2013/0240963 A1 | 9/2013 | Beach et al. | | |
| 2014/0091411 A1* | 4/2014 | Manipatruni | H01L 27/22 | 257/421 |
| 2014/0139265 A1* | 5/2014 | Manipatruni | H03K 19/16 | 326/101 |
| 2014/0169088 A1* | 6/2014 | Buhrman | G11C 11/18 | 365/158 |
| 2014/0282693 A1* | 9/2014 | Soundararajan | H04N 21/435 | 725/32 |
| 2015/0154388 A1* | 6/2015 | Sakamoto | H04L 63/08 | 726/19 |
| 2015/0255134 A1* | 9/2015 | Uchida | H01L 43/08 | 257/421 |
| 2016/0043301 A1* | 2/2016 | Butler | H01L 43/10 | 257/427 |
| 2017/0025602 A1* | 1/2017 | Liu | G11C 11/161 | |
| 2017/0069831 A1* | 3/2017 | Nikonov | H01L 43/10 | |

OTHER PUBLICATIONS

Office Action including Search Report (3 pages) from the Taiwan Intellectual Property Office (the IPO) dated Mar. 11, 2016 for Taiwan Patent Application No. 104105341 and English Translation (2 pages) thereof.

Notification of Transmittal of the International Search Report and the Written Opinion of the International Searching Authority for PCT/US2014/031781 filed Mar. 25, 2014 dated Dec. 23, 2014, 12 pages.

Notification Concerning Transmittal of International Preliminary Report on Patentability for PCT/US2014/031781 dated Oct. 6, 2016 (9 pages).

* cited by examiner

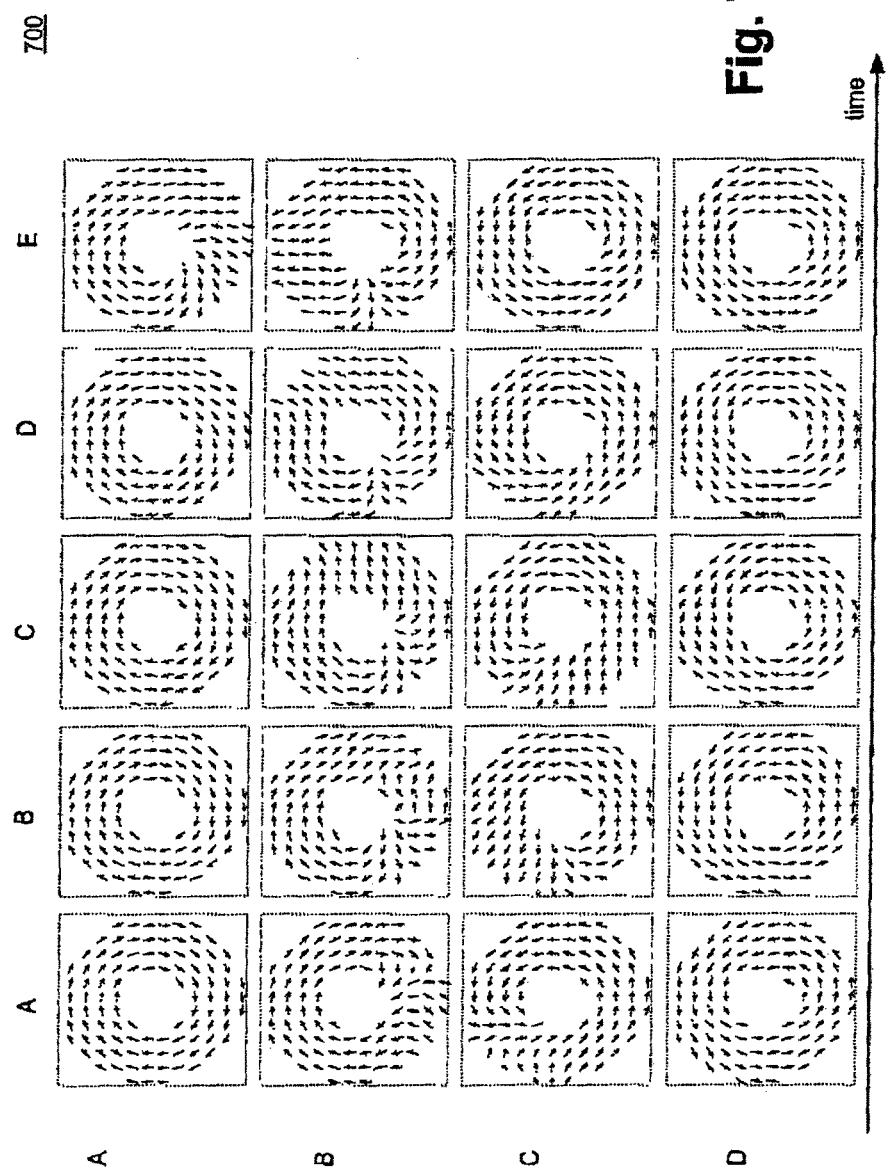

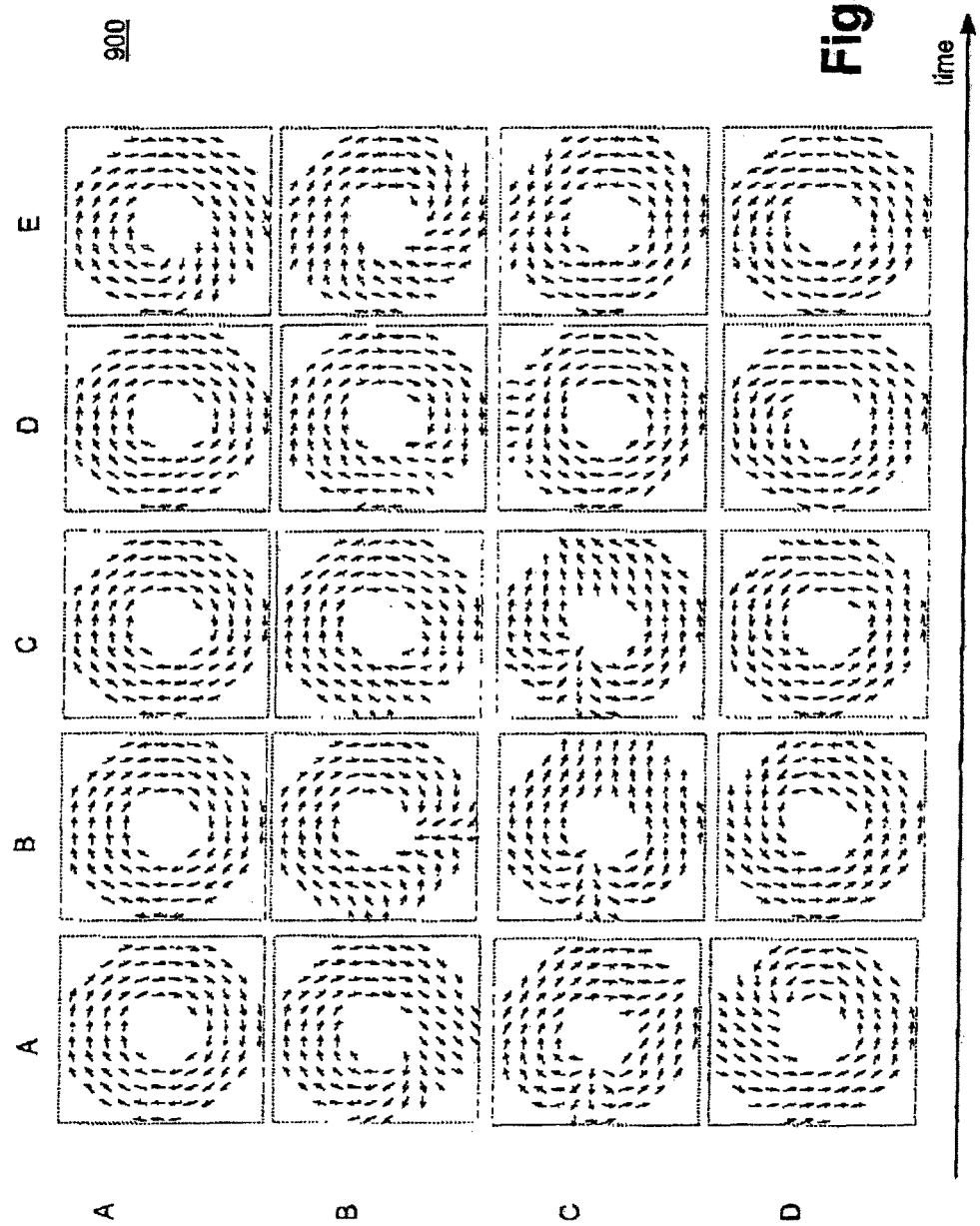

MAGNETIC DOMAIN WALL LOGIC DEVICES AND INTERCONNECT

This patent application is a U.S. National Phase Application under 35 U.S.C. 371 of International Application No. PCT/US2014/031781 filed Mar. 25, 2014.

BACKGROUND

To seek a way to continue integrated circuit scaling and make computation more energy efficient, spintronic devices can be used. In spintronic devices, electron spins carry and store the information. One feature of such devices is their non-volatility (i.e., the computational state is preserved even when power to the circuit is turned OFF). This feature opens a path to normally-OFF, instantly-ON logic chips which consume much less static power and thus are very desirable for mobile systems. Another feature of spintronic devices is that a collective state of particles (rather than individual electrons) experiences switching. Thus, spintronic devices have a much lower limit of switching energy per bit. The supply voltage of a spintronic device may not be related to leakage current and can be reduced to tens of milli-volts (mV). This leads to lower active power.

However, known spintronic logic devices may not be cascaded because the magnetic signal has a finite propagation range and may not drive the next stage (i.e., no means for fan-out). Known spintronic logic devices may not isolate input from output because magnetic signal can propagate in either direction.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 7 illustrates simulation results for magnetic directions over time in the spin-torque majority magnetic domain wall gate in a ring topology, according to one embodiment of the disclosure.

FIG. 9 illustrates simulation results for magnetic directions over time in the spin-torque magnetic domain wall gate with a fan-out of three, according to one embodiment of the disclosure.

DETAILED DESCRIPTION

Figure 1A:
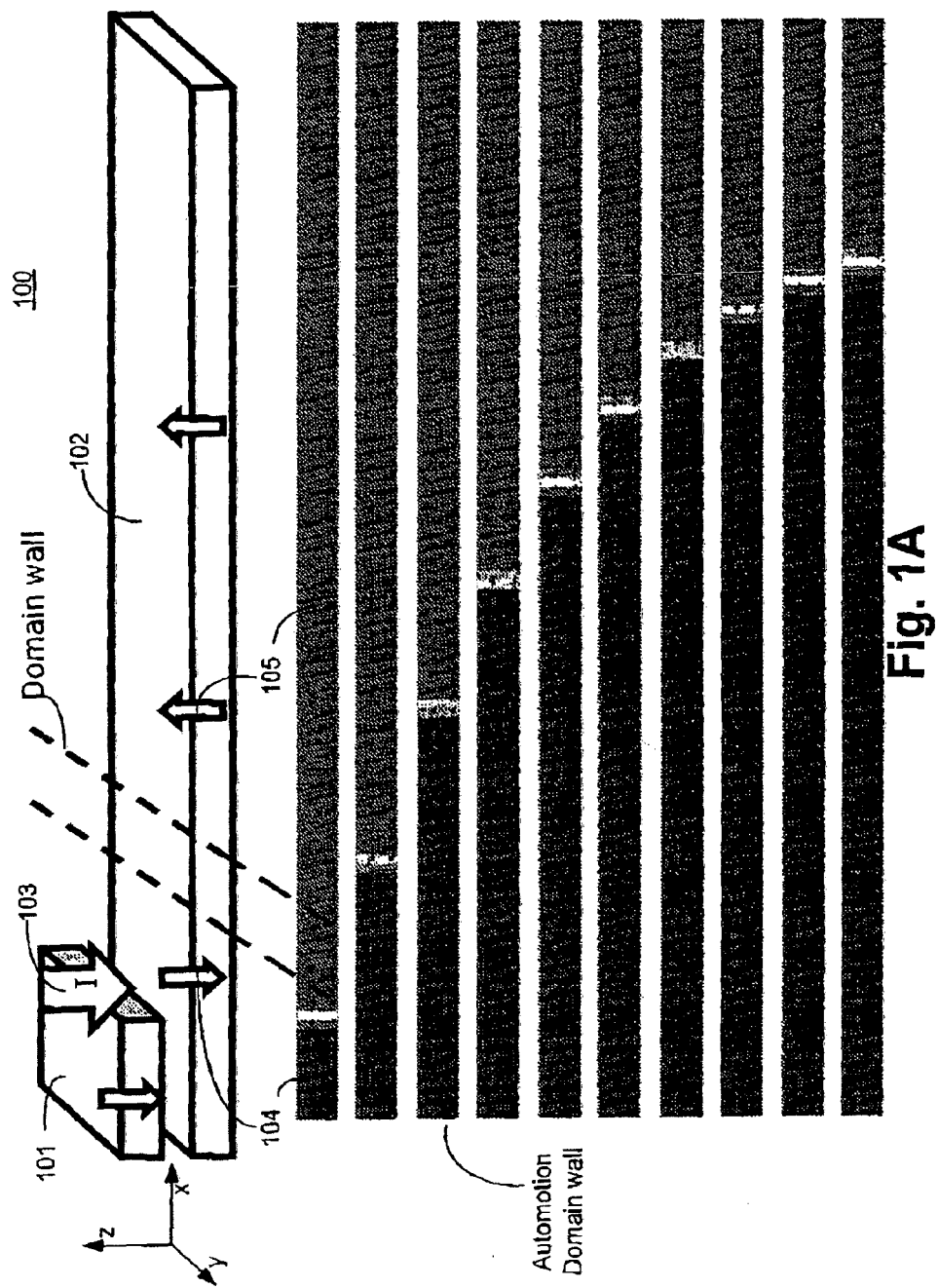
FIG. 1A illustrates an apparatus to generate automotion of domain walls through a ferromagnetic material, according to one embodiment of the disclosure.

Some embodiments describe magnetic domain wall logic devices including interconnect that allows automotion of domain walls in ferromagnetic wires with in-plane magnetization. Some embodiments describe short ferromagnetic interconnects with spin torque magnetic repeater(s) and/or inverters. In one embodiment, an apparatus is provided which comprises: first, second, and third free magnetic layers; a first metal layer of first material coupled to the first and third free magnetic layers; and a second metal layer of second material different from the first material, the second metal layer coupled to the second and third free magnetic layers. In one embodiment, the first metal layer is composed of a transition metal from the platinum group of the periodic table (e.g., Ru). In one embodiment, the first, second, and third free magnetic layers are ferromagnetic layers.

Some embodiments describe spin torque majority magnetic domain wall logic gates for in-plane magnetization configured in a shape of a ring. In one embodiment a spin torque majority gate device is provided which comprises: a free magnetic layer configured in ring; and first, second, third, and fourth free magnetic layers coupled to the free magnetic layer. Some embodiments describe magnetic domain wall logic devices that can be cascaded without limitation on the number of cascaded stages.

The embodiments continue to exhibit properties of non-volatility (i.e., they can preserve their states even when power to the devices is switched OFF). Integrated circuits formed from the magnetic domain wall logic devices of the embodiments consume less energy than conventional CMOS circuits. One reason for low power consumption is that the integrated circuits can be put to sleep state for longer time (e.g., milliseconds) and in relatively short periods of time (e.g., 100 s of ns) to avoid standby power dissipation with little energy expense compared to conventional CMOS circuits.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical wire, Square Wire, or Rectangular Ribbon Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Spin torque is produced by currents passing through the fixed ferromagnetic (FM) layers. This spin torque creates domain walls propagating in the free FM layer formed into an area or an interconnect (i.e., wire). However, the propagation of the domain wall halts after a certain distance (e.g., distance equivalent to a size of a 1-bit adder). One reason the domain wall stops in an FM layer is due to damping or line edge roughness "pinning" This stopping of the domain wall propagation limits the maximum number of stages of existing spin torque based designs that can be cascaded together. Spin torque based repeaters would increase the maximum distance of domain wall propagation. Domain walls may also propagate back and forth in an oscillatory motion in a narrow FM layer because inputs and outputs are not isolated in existing spin torque based logic designs or because there is reflection off of a FM layer's edges e.g. the ends of an FM interconnect.

FIG. 1A illustrates an apparatus 100 to generate automotion of domain walls through a ferromagnetic material, according to one embodiment of the disclosure. In one embodiment, apparatus 100 comprises FM layer 101 coupled to FM interconnect 102. Here, FM layer 101 receives an input current pulse 103 which creates a domain wall that propagates through interconnect. In previously published versions of spin majority gates, the current was on during the time of; formation of DW, their propagation from the inputs to the output, oscillatory motion of DW, and until the magnetization arrived at its final pattern. In this embodiment, short pulses of current necessary to create DW are used. Oscillatory motion of domain walls is avoided by design of interconnects as in FIG. 1A and repeaters as in FIG. 2. One example of the input current pulse is shown with reference to FIG. 1B.

Figure 1B:
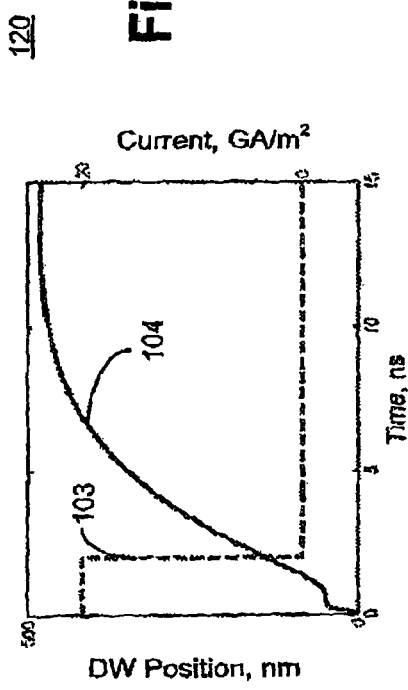
FIG. 1B illustrates a plot showing a current pulse response to the apparatus of FIG. 1A, according to one embodiment of the disclosure.

FIG. 1B illustrates a plot 120 showing a current pulse response to the apparatus of FIG. 1A, according to one embodiment of the disclosure. It is pointed out that those elements of FIG. 1B having the same reference numbers (or names) as the elements of any other figure can operate or function in any manner similar to that described, but are not limited to such.

Here, x-axis is time, y-axis to the left is Domain Wall (DW) position in nm, and y-axis to the right is magnitude of input current in $GA/m^2$ applied to FM layer 101. Referring back to FIG. 1A, when current pulse 103 (e.g., with a pulse duration of less than 2 ns) is applied to FM layer 101, DW 104 begins to propagate along FM layer 102. As DW propagates, the direction of magnetization changes from 104 to 105. The automotion of DW is illustrated by the plot below FM layer 102. This plot shows snap shots in time of the magnetization in FM layer 102. Here, the arrows indicate the projections of magnetization on the plane of the chip. For example, 104 corresponds to direction "up" for the projection of magnetization perpendicular to the chip, and 105 corresponds to direction "down" for the projection of magnetization perpendicular to the chip.

Here, magnetization 104 propagates from left to right when a small current pulse is applied to FM layer 101. In one embodiment, after the current pulse is applied, the DW propagates on their own without the need of current to propel them forward. This embodiment allows unidirectional repeaters to be coupled to FM layer 102 to allow the DW to propagate longer distances. In one embodiment, DW is detected and regenerated (i.e., repeated) to propagate DW as further depicted in FIG. 2.

Referring back to FIG. 1A, the magnetization direction "up" may correspond to logic 1 and the magnetization direction "down" may correspond to logic 0. In another embodiment, projection of magnetization on another axis is used to designate logic 0 and logic 1. In one embodiment, the magnetic logic states are converted to electrical logic values using the effect of magnetoresistance (MR) in a stack of ferromagnetic layers, as further explained in FIG. 4. Referring back to FIG. 1A, in known DW devices, DW propagates over a small distance and is then converted to electrical signal. Therefore cascading other DW logic devices to the interconnect is not encountered. The automotion of DW using a small current pulse in the embodiments of the present disclosure allows for other DW devices to be cascaded with the interconnect.

Table 1 shows simulation results for DW automotion for typical parameters of two cases—of magnetization in-plane of the chip and magnetization out-of-plane of the chip. The DW width and maximum speed is determined by demagnetization (or, equivalently, shape anisotropy) and by material anisotropy of the ferromagnetic wire. The maximum propagation distance till a DW stops as shown in FIG. 1A, is additionally dependent on the damping coefficient, $\alpha=0.01$ taken here. The time to traverse a 400 nm interconnect at maximum speed is also calculated

TABLE 1

DW Characteristics

| M | DW width | DW maximum propagation speed | DW propagation distance | Delay of interconnect |
|---|---|---|---|---|
| In-plane | 8 nm | 670 m/s | 400 nm | 0.6 ns |
| Out-of-plane | 23 nm | 120 m/s | 1150 nm | 10 ns |

Figure 2:
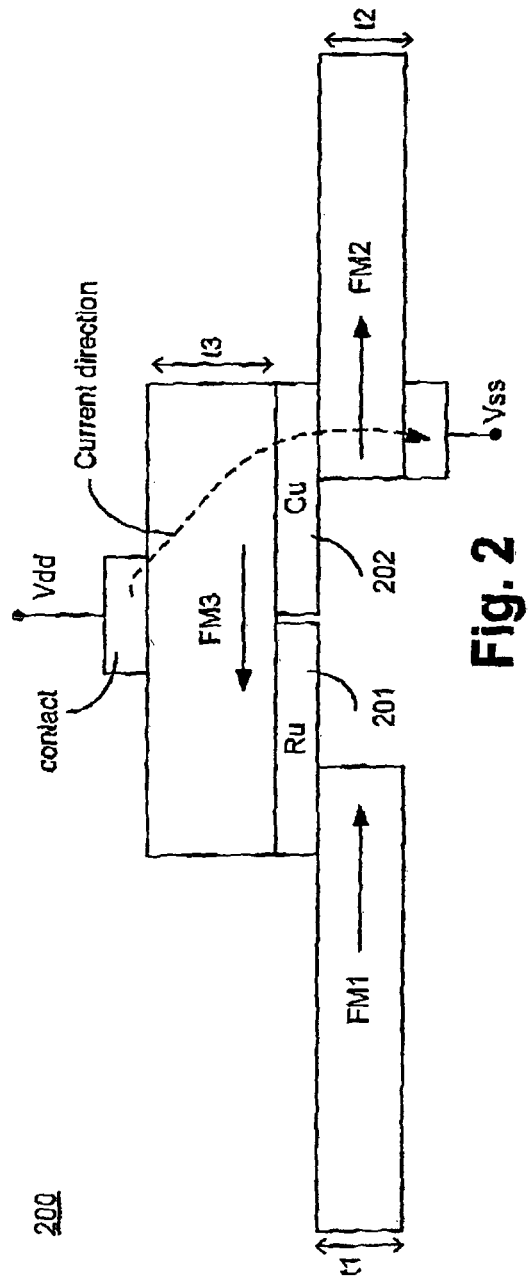
FIG. 2 illustrates a magnetic domain wall repeater, according to one embodiment of the disclosure.

FIG. 2 illustrates a magnetic DW repeater 200, according to one embodiment of the disclosure. It is pointed out that those elements of FIG. 2 having the same reference numbers (or names) as the elements of any other figure can operate or function in any manner similar to that described, but are not limited to such.

Repeater 200 comprises a first FM (FM1) layer, second FM (FM2) layer, third FM (FM3) layer, first non-magnetic metal layer 201, and second non-magnetic metal layer 202, and FM contacts. In one embodiment, FM1, FM2, and FM3 are free magnetic layers (i.e., they are not pinned layers). Conversely, in known spin logic devices one free and one pinned FM layer is used. In one embodiment, the FM contact on FM1 provides input "In," the FM contact on FM2 provides output "Out," and FM contact on FM3 is biased by power supply Vdd. In one embodiment, the FM contact Vdd is placed substantially in the middle top of FM3 layer. In one embodiment, an FM contact Vss (ground) is coupled to the FM2 layer near the end of FM2 which is closer to FM3.

In one embodiment, FM1 layer is coupled to FM3 layer via first non-magnetic metal layer 201. In one embodiment, FM2 layer is coupled to FM3 layer via second non-magnetic metal layer 202. In one embodiment, the first non-magnetic metal layer is composed of a transition metal from the platinum group of the periodic table. For example, the transition metal from the platinum group of the periodic table is Ru. In one embodiment, second non-magnetic metal layer 202 is composed of Cu. In one embodiment the Ru layer 201 is formed with thickness of 0.85 nm. This thickness promotes quantum exchange coupling between electrons in layers FM1 and FM3 which favors anti-parallel alignment of magnetizations in them. In other embodiments, layer 201 is one of Cu, Ta, Pd, or Pt, and is formed with other thicknesses. In one embodiment, first non-magnetic metal layer 201 is separated from non-magnetic metal layer 202 by a gap (e.g., 5 nm to 10 nm) filled with insulating oxide. In one embodiment, first non-magnetic metal layer 201 abuts (i.e., no gap) non-magnetic metal layer 202. In one embodiment, the FM3 layer is thicker than thicknesses of the first and second magnetic layers, where "t3" is the thickness of FM3 layer, "t1" is the thickness of FM1 layer, and "t2" is the thickness of FM2 layer. In one embodiment, "t1" is substantially equal to "t2."

In this embodiment, magnetization arriving from the left in the bottom of FM1 layer switches the magnetization direction of the FM3 layer such that the magnetization direction of FM1 layer is opposite to the magnetization direction of the FM3 layer. This difference in direction in magnetization is determined by the effect of exchange coupling. In one embodiment, FM1 is interconnect 102 of FIG. 1 which propagates the DW from left to right. Referring back to FIG. 2, FM3 layer and FM1 layer are coupled via exchange coupling. Exchange coupling ensures that magnetizing directions of FM3 and FM1 are anti-parallel to each other. The DW from FM1 switches FM3 magnetizing direction in a short time (e.g., 1 ns). In one embodiment, FM1, FM2, and FM3 layers hold the computational variable.

In one embodiment, Vdd and Vss electrodes coupled to FM3 and FM2 layers, respectively, cause a current to flow (from Vdd to Vss) which creates spin torque in the FM2 layer to switch magnetization direction in FM2 to be opposite of the magnetization direction in FM3. Here, the spin torque in layer FM3 does not switch its magnetization due to larger thickness or higher magnetization in layer FM3 than those in FM2. As a result, the magnetization direction of FM1 and FM2 is the same which creates a repeater (or buffer/non-inverting) logic function. Here, the directions of magnetization are in-the-plane of the chip having repeater 200.

In this embodiment, the direction of magnetization signal is only from left to right i.e., from FM1 to FM2. One reason for uni-direction in magnetization signal is that the resistance of the path from Vdd through FM3 layer to Vss through FM2 layer is much smaller than the resistance of the path from Vdd through the FM1 layer to any other contact at bias Vss. Therefore, current from Vdd to FM1 layer is much smaller than current from Vdd to FM2 layer and is not enough to produce magnetization switching. Resistivity of first non-magnetic layer 201 (e.g., Ru) is higher (e.g., 5 times) than resistivity of second non-magnetic layer 202 (e.g., Cu), which directs the path of current in one direction i.e., unidirectional spin torque solves the problem of lack of I/O isolation.

Figure 3:
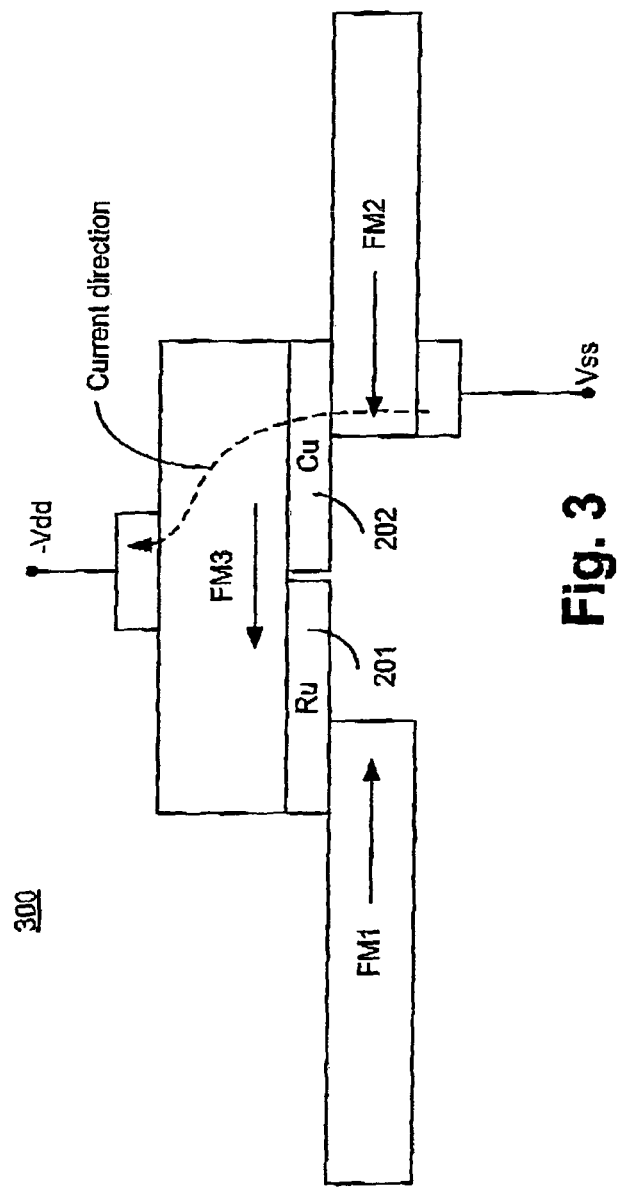
FIG. 3 illustrates a magnetic domain wall inverter, according to one embodiment of the disclosure.

FIG. 3 illustrates a magnetic DW inverter 300, according to one embodiment of the disclosure. It is pointed out that those elements of FIG. 3 having the same reference numbers (or names) as the elements of any other figure can operate or function in any manner similar to that described, but are not limited to such. So as not to obscure the embodiments of FIG. 3, differences between repeater 200 and inverter 300 are discussed.

In one embodiment, the positive supply contact is replaced with a negative power supply (i.e., −Vdd). In this embodiment, the current flows from Vss to −Vdd which changes the direction of spin torque in FM2 layer compared to the direction of spin torque in FM2 layer of repeater 200. As a result the magnetization direction of FM1 is opposite to the magnetization direction of FM2 to realize the function of an inverter.

Like in repeater 200, in this embodiment, the direction of magnetization signal is only from left to right i.e., from FM1 to FM2. One reason for uni-direction in magnetization signal is that the resistance of the path from Vss through FM2 layer to −Vdd through FM3 layer is much smaller than from −Vdd through the FM1 layer to any other contact at bias Vss, i.e., current from −Vdd to FM1 layer is much smaller than current from Vss to FM3 layer and is not enough to produce magnetization switching.

Figure 4:
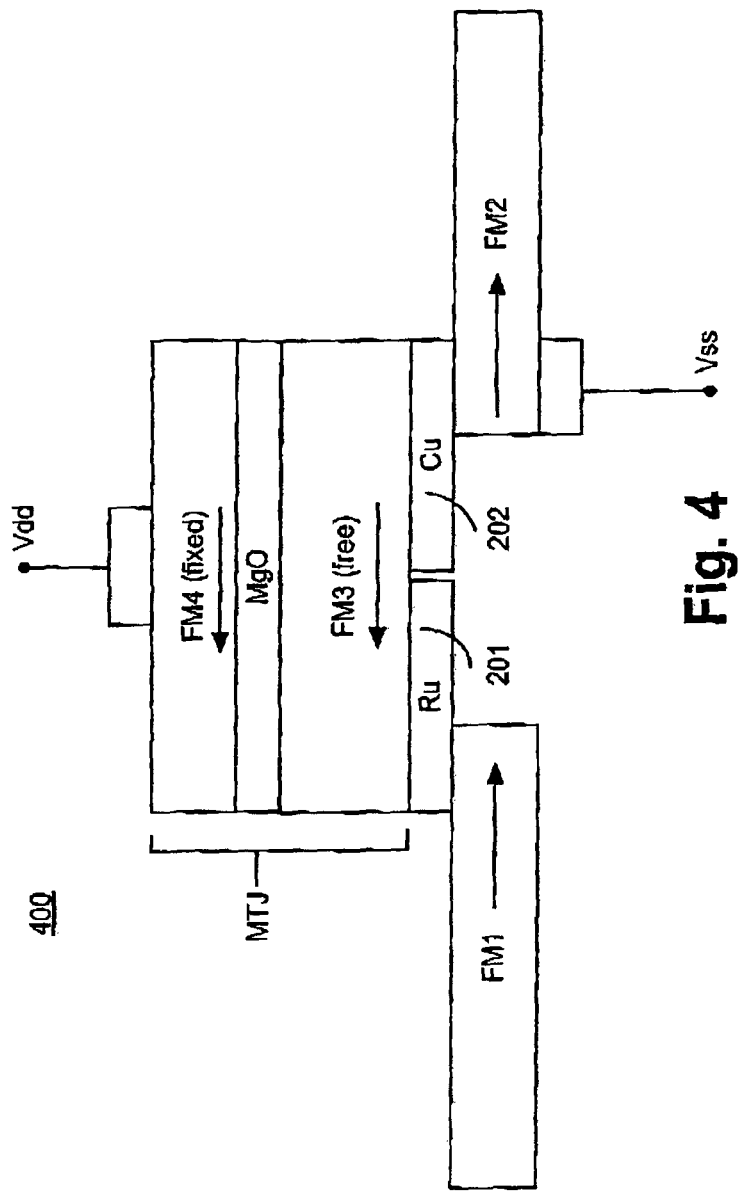
FIG. 4 illustrates a magnetic domain wall repeater with a magnetic tunneling junction device to provide output, according to one embodiment of the disclosure.

FIG. 4 illustrates a magnetic DW repeater 400 with a magnetic tunneling junction device (MTJ) to provide output, according to one embodiment of the disclosure. It is pointed out that those elements of FIG. 4 having the same reference numbers (or names) as the elements of any other figure can operate or function in any manner similar to that described, but are not limited to such. So as not to obscure the embodiments of FIG. 4, differences between repeater 200 and repeater 400 are discussed.

In one embodiment, repeater 400 comprises the same structure as repeater 200, but with an MTJ formed on top of FM3 layer using FM3 layer as the free layer of the MTJ device. In one embodiment, fixed layer FM4 of MTJ is separated from FM3 layer by a layer of MgO. In one embodiment, fixed layer FM4 is coupled at the output port to read data. The computation variable is encoded in the direction of magnetization in layer FM3: e.g. "right" corresponds to logical 1, and "left" corresponds to logical zero. This in turn corresponds to anti-parallel and parallel alignment of magnetization in layers FM3 and FM4, respectively. These alignments cause higher and lower values of resistance of the path from Vss to Vdd, respectively, due to the effect of magnetoresistance. The difference in these resistances causes different current from Vdd to Vss. In one embodiment, this current is passed to an input of a sense amplifier (not shown) and thus converted to an electrical signal. In one embodiment, fixed layer FM4 is coupled only at the output port to read data. Here, the output port "Out" from FIG. 2 is removed. In one embodiment, Vdd contact is formed on top of FM4 layer. In one embodiment, Vdd contact is replaced with −Vdd contact to convert the function of repeater to an inverter. In one embodiment, the presence of a tunneling barrier, such as MgO in a MTJ ensures high magnetoresistance for read operation.

Figure 5:
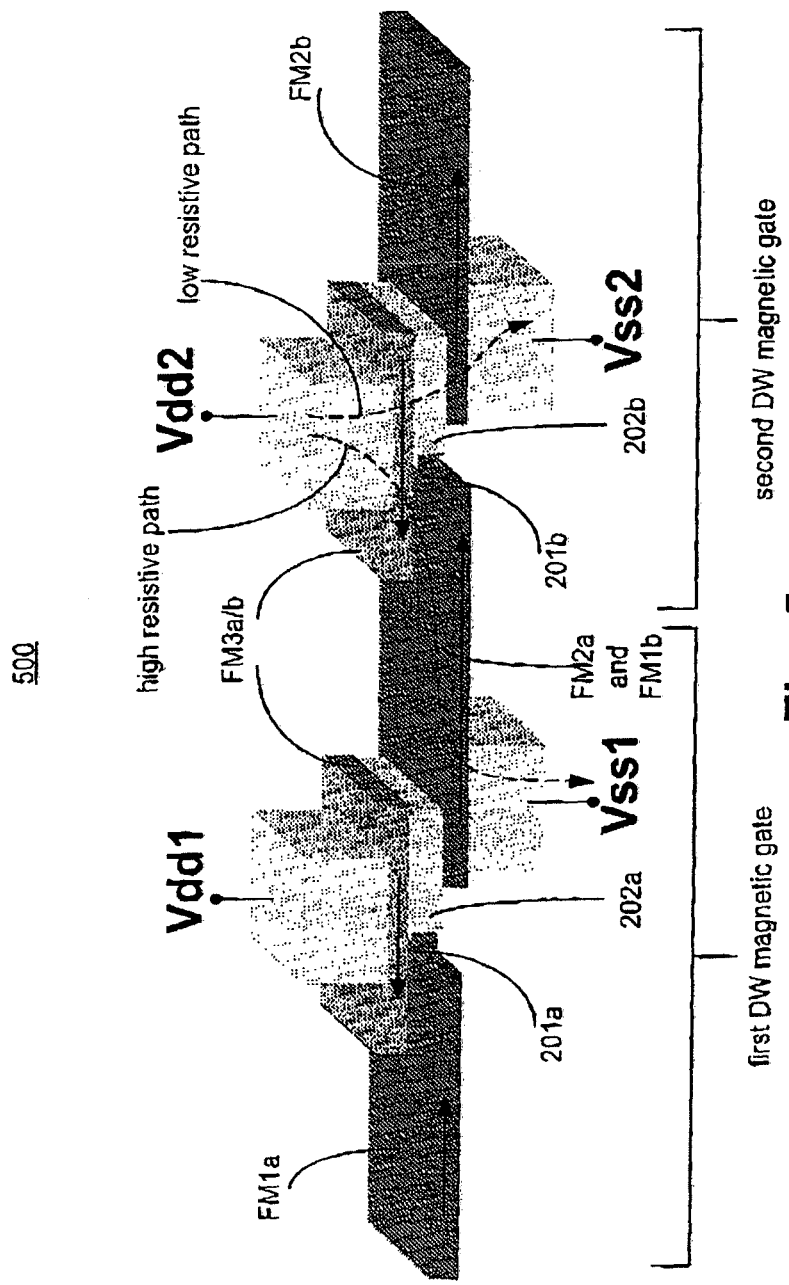
FIG. 5 illustrates a cascaded magnetic domain wall gate, according to one embodiment of the disclosure.

FIG. 5 illustrates a cascaded magnetic DW gate 500, according to one embodiment of the disclosure. It is pointed out that those elements of FIG. 5 having the same reference numbers (or names) as the elements of any other figure can operate or function in any manner similar to that described, but are not limited to such.

Unlike prior art spin torque gates where input and output are not isolated, the embodiment provides unidirectional spin torque. The unidirectional spin torque allows for cascading multiple magnetic domain wall gates, according to one embodiment. In one embodiment, repeater 200 can be cascaded with another repeater and/or inverter and so on. One such embodiment is illustrated by cascaded gate 500.

In this embodiment, the first magnetic DW device comprises: free FM1a, FM2a, and FM3a layers, and non-magnetic metal layers 201a and 202a. In one embodiment, second magnetic DW device comprises: free FM1b, FM2b, and FM3b layers, and non-magnetic metal layers 201b and 202b. Properties of FM layers FM1a/b, FM2a/b, FM3a/b, and non-magnetic layers 201a/b are 202a/b are similar to the properties of FM layers FM1, FM2, and FM3 of FIG. 2, and non-magnetic layers 201 and 202 of FIG. 2 respectively.

Referring back to FIG. 5, in one embodiment, FM1a layer is coupled to FM3a layer via non-magnetic metal layer 201a. In one embodiment, FM2a layer is coupled to FM3a layer via non-magnetic metal layer 202a. In one embodiment, FM1b layer is coupled to FM3b layer via non-magnetic metal layer 201b. In one embodiment, FM2a layer is coupled to FM3a layer via non-magnetic metal layer 202b. In this embodiment, FM2a and FM1b layers are merged with one another to cascade the first magnetic DW device with the second magnetic DW device.

In this embodiment, magnetization signal propagates only in one direction (i.e., from left to right) because resistance of the path from Vdd2 to Vss1 is much higher than resistance of the path from Vdd2 to Vss2. Here, Vdd1 and Vdd2 are tied to Vdd, while Vss1 and Vss2 are tied to Vss. In such an embodiment, corresponding current in the high resistance path is smaller than the current in the low resistance path and not enough to produce magnetic switching.

Figure 6A:
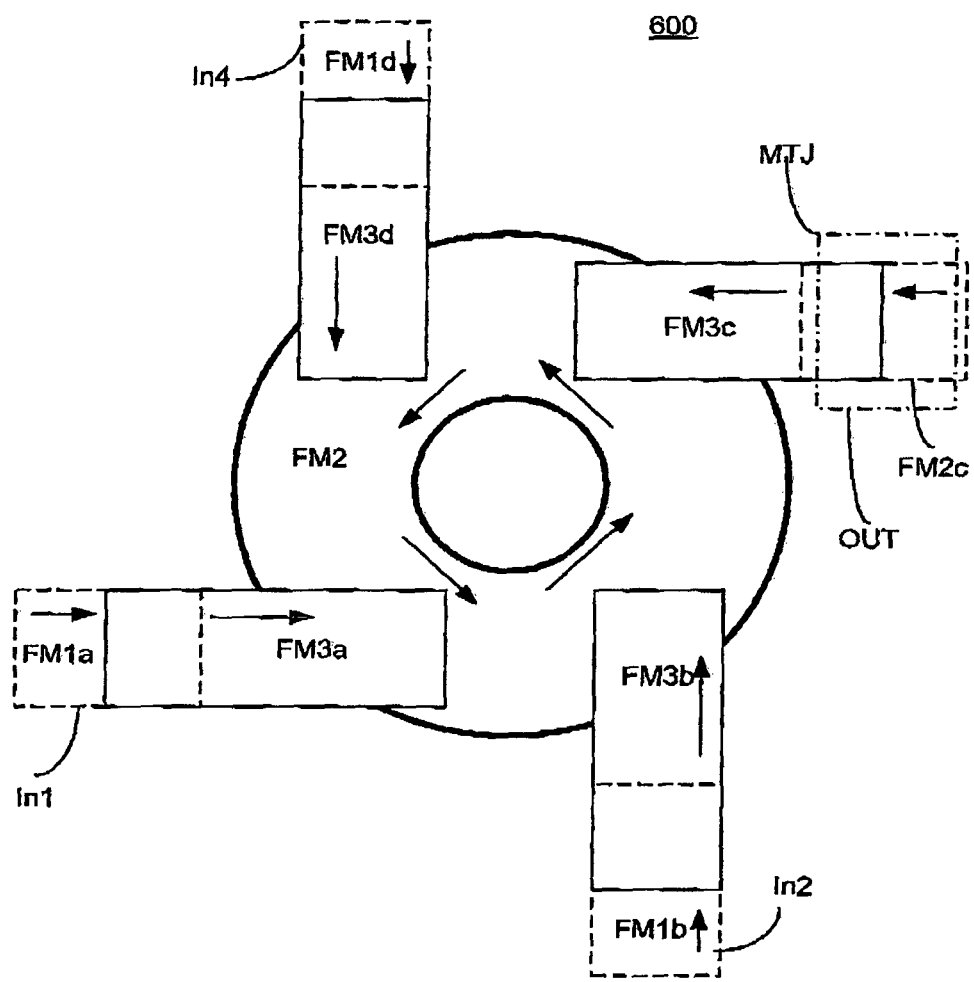
FIG. 6A illustrates a top view of a spin-torque majority magnetic domain wall gate in a ring topology, according to one embodiment of the disclosure.

FIG. 6A illustrates a top view of a spin-torque majority magnetic DW gate 600 in a ring topology, according to one embodiment of the disclosure. It is pointed out that those elements of FIG. 6A having the same reference numbers (or names) as the elements of any other figure can operate or function in any manner similar to that described, but are not limited to such.

In one embodiment, majority gate 600 comprises three input first FM layers FM1a, FM1b, and FM1d that provide inputs In1, In2, and In4 respectively; an output FM second layer FM2c; shared second FM layer FM2; and four third FM layers FM3a, FM3b, FM3c, and FM3d. Properties of FM layers FM1a/b/d, FM2, FM2c, FM3a/b/c/d, FM4a/b/c/d, and non-magnetic layers 201a/b/c/d are 202a/b/c/d are similar to the properties of FM layers FM1, FM2, and FM3 of FIG. 2, and non-magnetic layers 201 and 202 of FIG. 2 respectively.

Referring back to FIG. 6A, in one embodiment, FM3a is coupled to FM2 via second non-magnetic metal layer (e.g., Cu) 202a (not shown); and FM3a is coupled to FM1a via first non-magnetic metal layer (e.g., Ru) 201a (not shown). In one embodiment, FM3b is coupled to FM2 via second non-magnetic metal layer (e.g., Cu) 202b (not shown); and FM3b is coupled to FM1b via first non-magnetic metal layer (e.g., Ru) 201b (not shown). FM3d is coupled to FM2 via second non-magnetic metal layer (e.g., Cu) 202d (not shown); and FM3d is coupled to FM1d via first non-magnetic metal layer (e.g., Ru) 201d (not shown). In one embodiment, the Output branch is coupled differently than the input branch. In one embodiment, FM3c is coupled to FM2 via first non-magnetic metal layer (e.g., Ru) 201c (not shown); and FM3c is coupled to FM2c via second non-magnetic metal layer (e.g., Cu) 202c (not shown).

In one embodiment, FM2 layer is circular in shape. In one embodiment, FM2 layer may be of other shapes so long as it forms a ring. In one embodiment, FM2 layer functions as a combiner such that magnetic signals from FM3a, FM3b, and FM3d are combined to generate a magnetic signal representing the majority, which is then detected on FM2c. In one embodiment, FM3a and FM3c are substantially parallel to one another. In one embodiment, FM3b and FM3d are substantially parallel to one another such that FM3b and FM3d are substantially perpendicular to the FM3a and FM3c layers. In one embodiment, FM3a, FM3b, and FM3d layers to provide respective spin torques to FM2. In one embodiment, FM2c layer provides an output indicating a logic function according to respective spin directions in the FM1a, FM1b, and FM1d layers.

In one embodiment, majority gate 600 performs combining of three magnetization vectors in the plane of the chip. In one embodiment, FM2 is shaped in a ring such that the incoming FM wires (from FM1a, FM1b, and FM1d) have magnetizations at a tangent to the ring of FM2. In one embodiment, spin torque at the areas of overlap of input wires and the ring of FM2 promote magnetization to be either clockwise or counter-clockwise direction i.e., the two logic states of the ring FM2. In such an embodiment, the majority of the inputs combine to set the corresponding magnetization direction in FM2. In this embodiment, magnetization of the output "Out" is set by the magnetization of the ring FM2 under it. In one embodiment, an MTJ is formed using FM3c as the free FM layer, followed by a layer of MgO, and fixed magnetic layer FM4.

Figure 6B:
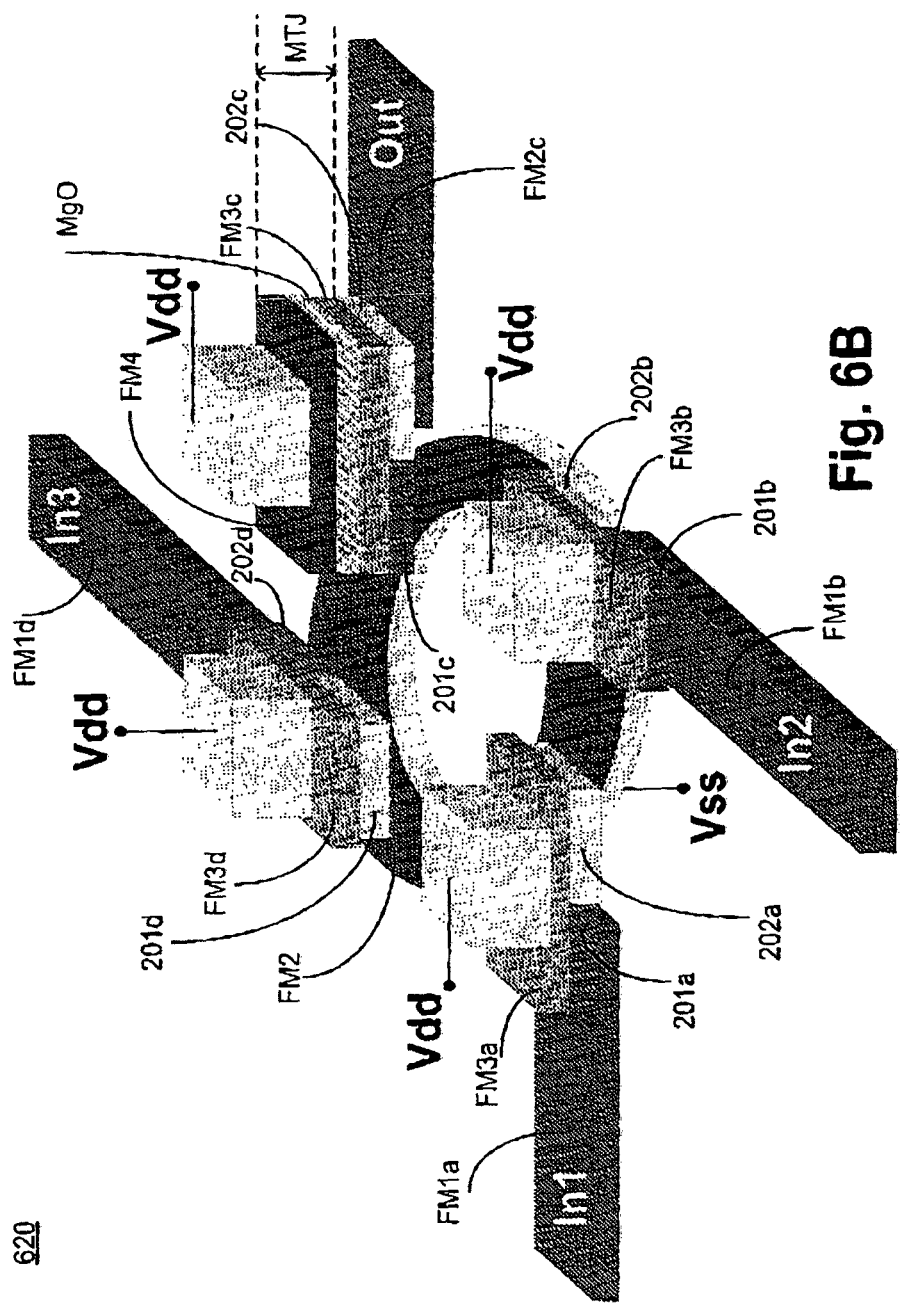
FIG. 6B illustrates a multi-dimensional view of the spin-torque majority gate in a ring topology, according to one embodiment of the disclosure.

FIG. 6B illustrates a multi-dimensional view 620 of the spin-torque majority gate 600 in the ring topology, according to one embodiment of the disclosure. It is pointed out that those elements of FIG. 6B having the same reference numbers (or names) as the elements of any other figure can operate or function in any manner similar to that described, but are not limited to such.

FIG. 7 illustrates simulation results of magnetic directions 700 over time in the spin-torque majority magnetic DW gate in a ring topology, according to one embodiment of the disclosure. It is pointed out that those elements of FIG. 7 having the same reference numbers (or names) as the elements of any other figure can operate or function in any manner similar to that described, but are not limited to such. In the simulation, the outer ring diameter is taken to be 120 nm, thickness of FM layer 2 nm, magnetization Ms=1 MA/m, damping coefficient $\alpha$=0.01, for example. Currents of 2.2 mA are passed through each input for 1 ns and then switched off. Referring to FIGS. 6A-B, magnetization in FM3a and in FM3b is modeled toward the ring, and magnetization in FM3c away from the ring.

Here, 20 snapshots of the magnetic directions in FM2 of FIGS. 6A-B are shown over time (every 0.1 ns). The snapshots run from row A along columns A to E and then down to row D along columns A to E. The initial condition of the magnetic directions in FM2 upon receiving inputs In1, In2, and In3 are shown in the snapshot AA (top left corner), and the final equilibrium state of the magnetic direction in FM2 is shown in snapshot DE (bottom right corner). Initially, magnetization is pointing clockwise in the ring. The spin torques from inputs FM3a and in FM3b work to switch magnetization to the opposite direction, while the torque from input FM3c works to maintain the original direction of magnetization. FM3c is coupled to FM2 via first non-magnetic metal layer (e.g., Ru) 201c (not shown); and FM3c is coupled to FM2c via second non-magnetic metal layer (e.g., Cu) 202c (not shown). Here, for the output, FM operates like an FM1 in FIG. 2, so FM couples to FM3c with exchange coupling (with Ru non-magnetic metal) not spin torque. FM3c uses spin torque to transfer FM3c magnetization to FM2c (i.e., Cu between FM3c and FM2c). Magnetization switches initially under the first two inputs, and them becomes pointing counter-clockwise in the entire ring.

Figure 8A:
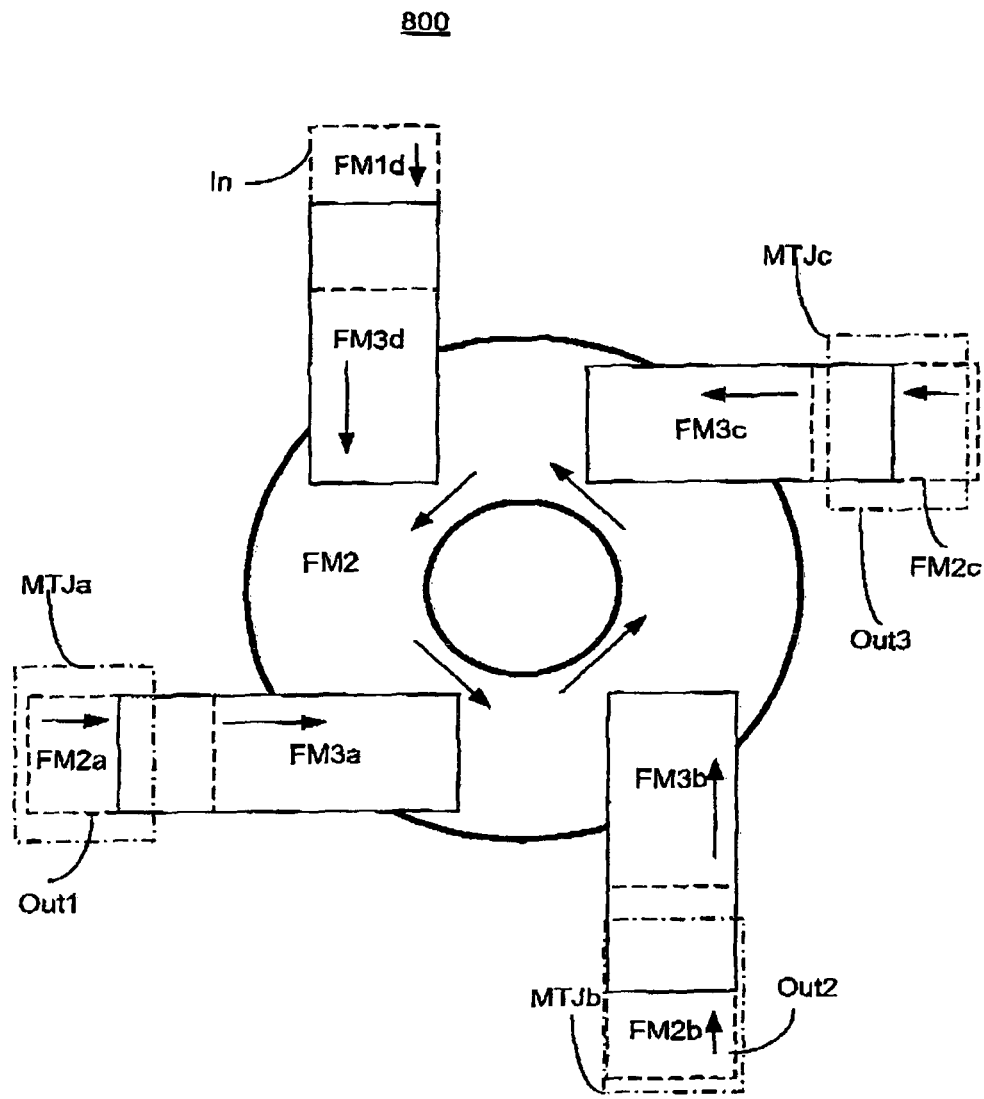
FIG. 8A illustrates a top view of a spin-torque magnetic domain wall gate with a fan-out of three in a ring topology, according to one embodiment of the disclosure.

FIG. 8A illustrates a top view 800 of a spin-torque magnetic domain wall gate with a fan-out of three in a ring topology, according to one embodiment of the disclosure. It is pointed out that those elements of FIG. 8A having the same reference numbers (or names) as the elements of any other figure can operate or function in any manner similar to that described, but are not limited to such.

In one embodiment, majority gate 800 comprises three output second FM layers FM2a, FM2b, and FM2c that provide Outputs Out1, Out2, and Out3 respectively; an input FM first layer FM1d; shared second FM layer FM2; and four third FM layers FM3a, FM3b, FM3c, and FM3d. Properties of FM layers FM1/d, FM2a/b/c, FM3a/b/c/d, FM4a/b/c/d, and non-magnetic layers 201a/b/c/d are 202a/b/c/d (show shown) are similar to the properties of FM layers FM1, FM2, and FM3 of FIG. 2, and non-magnetic layers 201 and 202 of FIG. 2 respectively.

Referring back to FIG. 8A, in one embodiment, FM3a is coupled to FM2 via first non-magnetic metal layer (e.g., Ru) 201a (not shown); and FM3a is coupled to FM2a via second non-magnetic metal layer (e.g., Cu) 202a (not shown). In one embodiment, FM3b is coupled to FM2 via first non-magnetic metal layer (e.g., Ru) 201b (not shown); and FM3b is coupled to FM2b via second non-magnetic metal layer (e.g., Cu) 202b (not shown). FM3c is coupled to FM2 via first non-magnetic metal layer (e.g., Ru) 201d (not shown); and FM3c is coupled to FM2c via second non-magnetic metal layer (e.g., Cu) 202c (not shown). In one embodiment, the input branch is coupled differently than the output branches. In one embodiment, FM3d is coupled to FM2 via second non-magnetic metal layer (e.g., Cu) 202d (not shown); and FM3d is coupled to FM1d via first non-magnetic metal layer (e.g., Ru) 202d (not shown).

In one embodiment, FM2 layer is circular in shape. In one embodiment, FM2 layer may be of other shapes so long as it forms a ring to couple the output FM layers and input FM layer. In one embodiment, FM2 layer functions as a fan-out repeater such that magnetic signal from FM3d is fanned out to FM3a, FM3b, and FM3c. In one embodiment, FM3a and FM3c are substantially parallel to one another. In one embodiment, FM3b and FM3d are substantially parallel to one another such that FM3b and FM3d are substantially perpendicular to the FM3a and FM3c layers. In one embodiment, FM1d layer provides the input to FM3d via exchange coupling and FM3d provides spin torque to FM2. In one embodiment, FM1a/b/c layers provide respective outputs indicating same magnetic direction as input spin torque on FM1d.

In one embodiment, majority gate 600 performs fan-out of one input magnetization vector in plane of the chip. In one embodiment, FM2 is shaped in a ring such that the incoming FM1d wire has magnetization at a tangent to the ring of FM2. In one embodiment, spin torque at the areas of overlap of input wire's FM3d and the ring of FM2 promote magnetization to be either clockwise or counter-clockwise direction i.e., the two logic states of the ring FM2. In this embodiment, magnetization of the outputs Out1, Out2, and Out3 are set by the magnetization of the ring FM2 under it.

In one embodiment, MTJs are formed on outputs only. In one embodiment, MTJ1 is formed using FM3a as the free FM layer, followed by a layer of MgO, and fixed magnetic layer FM4a. In one embodiment, MTJ2 is formed using FM3b as the free FM layer, followed by a layer of MgO, and fixed magnetic layer FM4b. In one embodiment, MTJ3 is formed using FM3c as the free FM layer, followed by a layer of MgO, and fixed magnetic layer FM4c.

Figure 8B:
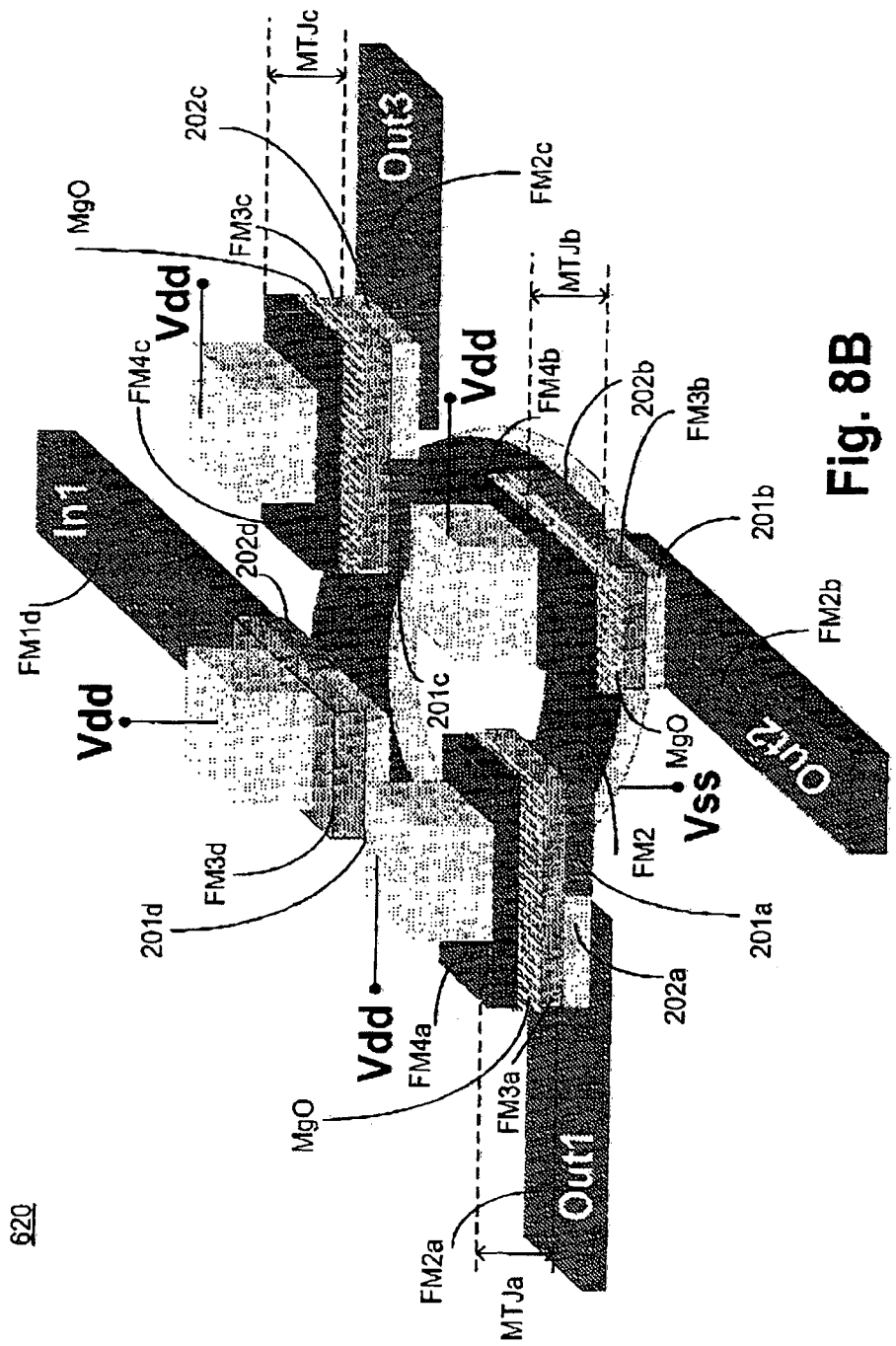
FIG. 8B illustrates a multidirectional view of a spin-torque magnetic domain wall gate with a fan-out of three in a ring topology, according to one embodiment of the disclosure.

FIG. 8B illustrates a multidirectional view 820 of the spin-torque magnetic domain wall gate with a fan-out of three in a ring topology of FIG. 8A, according to one embodiment of the disclosure. It is pointed out that those elements of FIG. 8A having the same reference numbers (or names) as the elements of any other figure can operate or function in any manner similar to that described, but are not limited to such.

FIG. 9 illustrates the simulation results for magnetic directions 900 over time in the spin-torque magnetic DW gate with a fan-out of three, according to one embodiment of the disclosure. The simulation uses the same parameters as those described with reference to FIG. 7. It is pointed out that those elements of FIG. 9 having the same reference numbers (or names) as the elements of any other figure can operate or function in any manner similar to that described, but are not limited to such.

Here, 20 snapshots of the magnetic directions in FM2 of FIGS. 8A-B are shown over time (every 0.1 ns). The snapshots run from row A along columns A to E and then down to row D along columns A to E. The initial condition of the magnetic directions in FM2 upon receiving input In1 are shown in the snapshot AA (top left corner), and the final equilibrium state of the magnetic direction in FM2 is shown in snapshot DE (bottom right corner). Initially, magnetization is pointing clockwise in the ring. The spin torques from the input FM3d works to switch magnetization to the opposite direction. Magnetization switches to pointing counter-clockwise in the entire ring, including under all three outputs.

Figure 10:
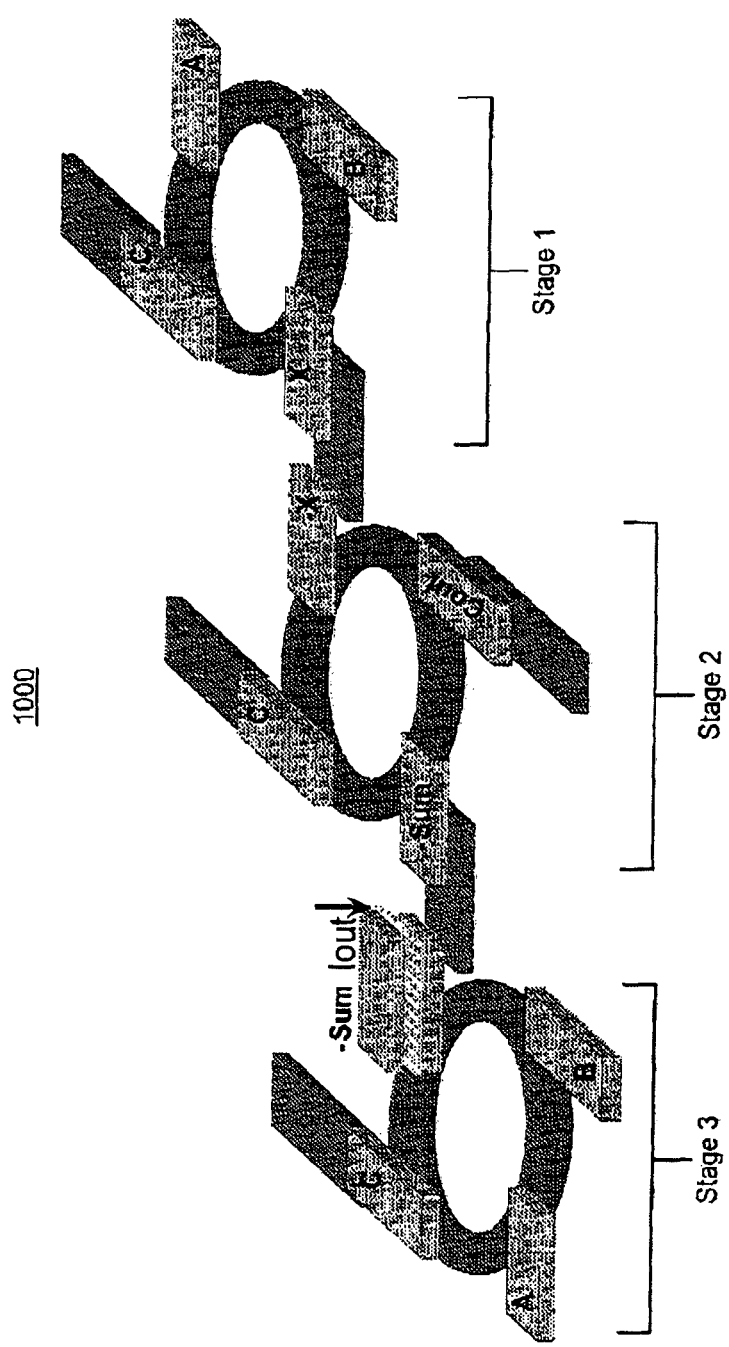
FIG. 10 illustrates a 1-bit adder using spin-torque majority magnetic domain wall gates in ring topologies, according to one embodiment of the disclosure.

FIG. 10 illustrates a 1-bit adder 1000 using spin-torque majority magnetic domain wall gates in ring topologies, according to one embodiment of the disclosure. It is pointed out that those elements of FIG. 10 having the same reference numbers (or names) as the elements of any other figure can operate or function in any manner similar to that described, but are not limited to such.

In one embodiment, spin-torque majority magnetic DW gates in ring topology as described in FIGS. 6A-6B are coupled together to form a 1-bit adder. Here, three stages of spin-torque majority magnetic DW gates are cascaded together as shown. In one embodiment, inputs 'A' and 'B' are bits of two numbers received and summed together. Here, 'C' is the carry and 'X' is result of intermediate operation. 'X' is turned to "−X" for the next stage by using an inverter as shown in FIG. 3. In one embodiment, an MTJ device is formed at the output "Sum" which is the result of adding inputs 'A' and 'B' provided the carry is "C." It is equivalent to a majority operation of "A," "B," and "C." Since the magnetization direction "forward" in a wire is counted as logic 1 and "backward" in a wire as logic 0, the direction of magnetization in the output of the left majority gate corresponds to "−Sum."

Figure 11:
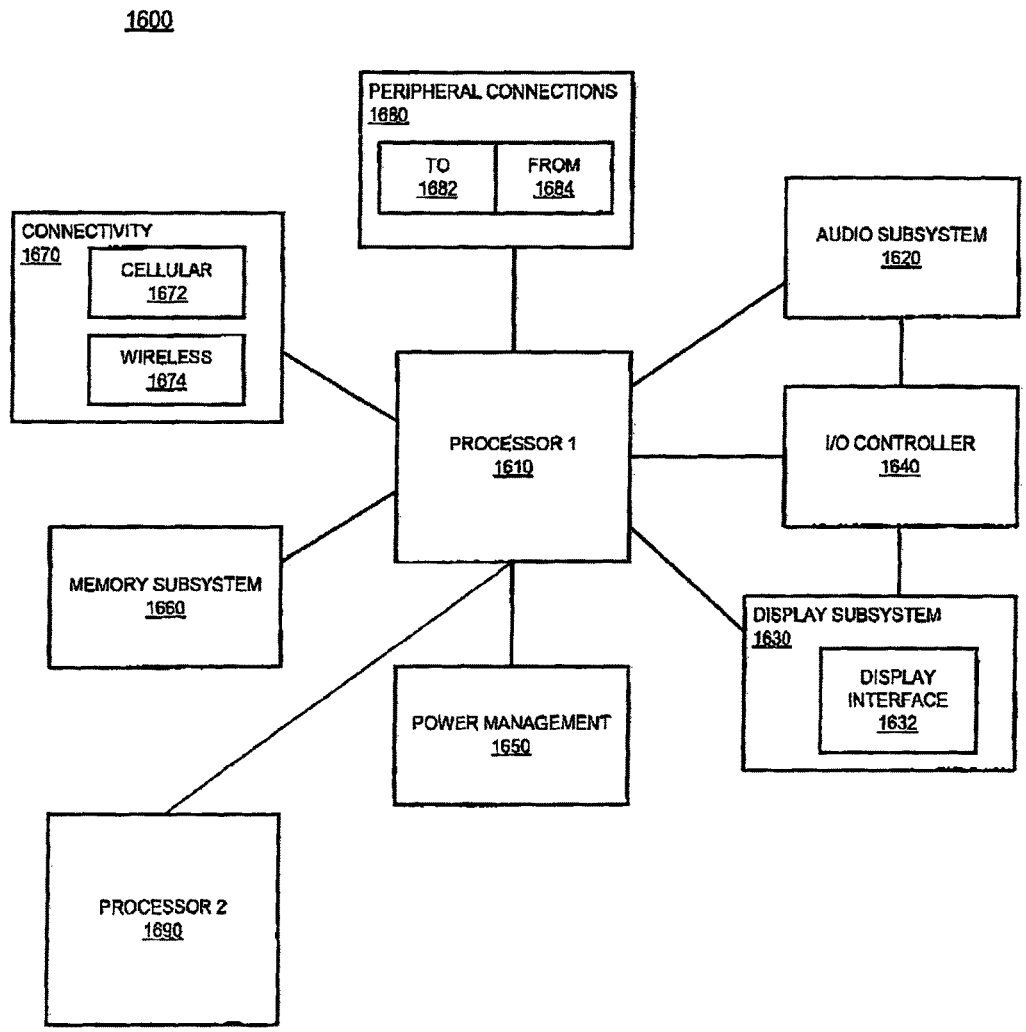
FIG. 11 is a smart device or a computer system or an SoC (system-on-chip) with magnetic domain wall logic devices and interconnect, according to one embodiment of the disclosure.

FIG. 11 is a smart device or a computer system or a SoC (system-on-chip) with magnetic DW logic devices and interconnect, according to one embodiment of the disclosure. FIG. 11 is a smart device or a computer system or an SoC (system-on-chip) with the bandgap reference architecture, according to one embodiment of the disclosure. It is pointed out that those elements of FIG. 11 having the same reference numbers (or names) as the elements of any other figure can operate or function in any manner similar to that described, but are not limited to such.

FIG. 11 illustrates a block diagram of an embodiment of a mobile device in which flat surface interface connectors could be used. In one embodiment, computing device 1600 represents a mobile computing device, such as a computing tablet, a mobile phone or smartphone, a wireless-enabled e-reader, or other wireless mobile device. It will be understood that certain components are shown generally, and not all components of such a device are shown in computing device 1600.

In one embodiment, computing device 1600 includes a first processor 1610 with magnetic DW logic devices and interconnect described with reference to embodiments. Other blocks of the computing device 1600 may also include apparatus with magnetic DW logic devices and interconnect described with reference to embodiments. The various embodiments of the present disclosure may also comprise a network interface within 1670 such as a wireless interface so that a system embodiment may be incorporated into a wireless device, for example, cell phone or personal digital assistant or a wearable device.

In one embodiment, processor 1610 (and/or processor 1690) can include one or more physical devices, such as microprocessors, application processors, microcontrollers, programmable logic devices, or other processing means. Processor 1690 may be optional. While the embodiment shows two processors, a single or more than two processors may be used. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to an "embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: first, second, and third free magnetic layers; a first metal layer of first material coupled to the first and third free magnetic layers; and a second metal layer of second material different from the first material, the second metal layer coupled to the second and third free magnetic layers. In one embodiment, the apparatus further comprises a power supply contact coupled to the third free magnetic layer. In one embodiment, the apparatus further comprises a ground contact coupled to the second free magnetic layer.

In one embodiment, the power supply contact is coupled to a positive power supply to achieve a function of a repeater. In one embodiment, the power supply contact is coupled to a negative power supply to achieve a function of an inverter. In one embodiment, the first metal layer forms an input, and wherein the second metal layer forms an output. In one embodiment, the first metal layer is coupled to a logic unit to provide a current pulse to cause a domain wall to propagate through the first metal layer.

In one embodiment, the first metal layer is composed of a transition metal from the platinum group of the periodic table. In one embodiment, the transition metal from the platinum group of the periodic table is Ru. In one embodiment, the second metal layer is composed of Cu. In one embodiment, the third free magnetic layer is thicker than thicknesses of the first and second magnetic layers. In one embodiment, the first and second metal layers are decoupled from one another. In one embodiment, the apparatus further comprises a domain wall device coupled to the first or second free magnetic layers.

In another example, a spin torque majority gate device is provided which comprises: a free magnetic layer configured in ring; and first, second, third, and fourth free magnetic layers coupled to the free magnetic layer. In one embodiment, the first and third free magnetic layers are substantially parallel to one another. In one embodiment, the second and fourth free magnetic layers are substantially parallel to one another such that the second and fourth free magnetic layers are substantially perpendicular to the first and third free magnetic layers. In one embodiment, the first, second, and fourth free magnetic layers to provide respective spin torques to the free magnetic layer, and wherein the third free magnetic layer to provide an output indicating a logic function according to respective spin directions in the first, second, and fourth free magnetic layers.

In one embodiment, the first free magnetic layer to provide spin torque to the free magnetic layer, and wherein the second, third, and fourth free magnetic layers to provide respective outputs according to spin direction in the first free magnetic layer. In one embodiment, each of the first, second, third, and fourth free magnetic layers comprises an apparatus according to the apparatus discussed above. In one embodiment, the free magnetic layer configured as a ring is coupled to the first, second, third, and fourth free magnetic layers via respective second metal layers.

In another example, a system is provided which comprises: a memory; a processor coupled to the memory, the processor having an apparatus according to the apparatus discussed above; and a wireless interface for allowing the processor to couple to another device. In one embodiment, the system further comprises a display unit. In one embodiment, the display unit is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   first, second, and third free magnetic layers;
   a first metal layer of first material coupled to the first and third free magnetic layers; and
   a second metal layer of second material different from the first material, the second metal layer coupled to the second and third free magnetic layers; and
   a domain wall device coupled to the first or second free magnetic layers.

2. The apparatus of claim 1 further comprises a power supply contact coupled to the third free magnetic layer.

3. The apparatus of claim 2 further comprises a ground contact coupled to the second free magnetic layer.

4. The apparatus of claim 3, wherein the power supply contact is coupled to a positive power supply to achieve a function of a repeater.

5. The apparatus of claim 3, wherein the power supply contact is coupled to a negative power supply to achieve a function of an inverter.

6. The apparatus of claim 2, wherein the first metal layer forms an input, and wherein the second metal layer forms an output.

7. The apparatus of claim 1, wherein the first metal layer is composed of a transition metal from the platinum group of the periodic table.

8. The apparatus of claim 7, wherein the transition metal from the platinum group of the periodic table is Ru.

9. The apparatus of claim 1, wherein the second metal layer is composed of Cu.

10. The apparatus of claim 1, wherein the third free magnetic layer is thicker than thicknesses of the first and second magnetic layers.

11. The apparatus of claim 1, wherein the first and second metal layers are decoupled from one another.

12. An apparatus comprising:
    first, second, and third free magnetic layers;
    a first metal layer of first material coupled to the first and third free magnetic layers; and
    a second metal layer of second material different from the first material, the second metal layer coupled to the second and third free magnetic layers;
    a power supply contact coupled to the third free magnetic layer, wherein the first metal layer is coupled to a logic unit to provide a current pulse to cause a domain wall to propagate through the first metal layer.

13. A spin torque majority gate device comprising: a free magnetic layer configured in ring; and
    first second, third, and fourth free magnetic layers coupled to the free magnetic layer, wherein the first and third free magnetic layers are substantially parallel to one another, wherein the second and fourth free magnetic layers are substantially parallel to one another such that the second and fourth free magnetic layers are substantially perpendicular to the first and third free magnetic layers.

14. The spin torque majority gate device of claim 13, wherein each of the first, second, third, and fourth free magnetic layers comprises an apparatus comprising:
    first, second, and third free magnetic layers;
    a first metal layer of first material coupled to the first and third free magnetic layers; and
    a second metal layer of second material different from the first material, the second metal layer coupled to the second and third free magnetic layers.

15. The spin torque majority gate device of claim 14, wherein the free magnetic layer configured as a ring is coupled to the first, second, third, and fourth free magnetic layers via respective second metal layers.

16. A spin torque majority gate device comprising:
    a free magnetic layer configured in ring; and
    first, second, third, and fourth free magnetic layers coupled to the free magnetic layer, wherein the first, second, and fourth free magnetic layers to provide respective spin torques to the free magnetic layer, and wherein the third free magnetic layer to provide an output indicating a logic function according to respective spin directions in the first, second, and fourth free magnetic layers.

17. A spin torque majority gate device comprising:
a free magnetic layer configured in ring; and
first, second, third, and fourth free magnetic layers coupled to the free magnetic layer, wherein the first free magnetic layer to provide spin torque to the free magnetic layer, and wherein the second, third, and fourth free magnetic layers to provide respective outputs according to spin direction in the first free magnetic layer.

* * * * *